(12) United States Patent
Fulkerson

(10) Patent No.: US 6,417,711 B2
(45) Date of Patent: *Jul. 9, 2002

(54) HIGH SPEED LATCH AND FLIP-FLOP

(75) Inventor: David E. Fulkerson, Chanhasen, MN (US)

(73) Assignee: Honeywell Inc., Morristown, NJ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/420,684

(22) Filed: Oct. 19, 1999

(51) Int. Cl.[7] .............................................. H03K 3/289
(52) U.S. Cl. ........................ 327/203; 327/210; 327/211; 327/215; 327/218
(58) Field of Search ................................ 327/197–203, 327/208–212, 215, 214, 218, 219; 326/86, 87, 56–58

(56) References Cited

U.S. PATENT DOCUMENTS

| | | | |
|---|---|---|---|
| 4,495,629 A | * 1/1985 | Zasio et al. ................. | 327/202 |
| 5,025,174 A | * 6/1991 | Shikata ....................... | 327/202 |
| 5,140,179 A | * 8/1992 | Takano ........................ | 327/203 |
| 5,173,870 A | * 12/1992 | Sukashita et al. .......... | 327/215 |
| 5,281,865 A | * 1/1994 | Yamashita et al. ......... | 327/208 |
| 5,621,340 A | 4/1997 | Lee et al. ...................... | 327/65 |
| 5,787,011 A | 7/1998 | Ko ................................ | 364/490 |
| 5,818,293 A | 10/1998 | Brehmer et al. ............. | 327/202 |
| 5,831,463 A | 11/1998 | Sachdev ...................... | 327/202 |
| 5,880,599 A | * 3/1999 | Bruno .......................... | 326/56 |
| 5,889,422 A | 3/1999 | Komoike et al. ............ | 327/208 |
| 5,920,218 A | 7/1999 | Klass et al. .................. | 327/200 |

FOREIGN PATENT DOCUMENTS

| | | |
|---|---|---|
| DE | 4007223 A1 | 9/1990 |
| EP | 0467273 | 1/1992 |
| JP | 61 087422 A | 5/1986 |
| JP | 63 051716 A | 3/1988 |

OTHER PUBLICATIONS

Neil H. E. Weste, Principle of CMOS VLSI Design, 2nd edition, 1993, Addison–Wesley Publishing Company, p. 91.*

(List continued on next page.)

*Primary Examiner*—Terry D. Cunningham
*Assistant Examiner*—Long Nguyen
(74) *Attorney, Agent, or Firm*—Dennis C. Bremer (57) ABSTRACT

A latch and flip-flop are disclosed that have a reduced clock-to-q delay and/or a reduced setup time. This is preferably accomplished by providing both a data input signal and a complement data input signal to the latch or flip-flop. The data input signal and the complement data input signal are selectively connected to opposite sides of a pair of cross-coupled gates via a switch or the like. The switch is preferably controlled by an enable signal, such as a clock. With the switch elements enabled, the data input signal is passed directly to a data output terminal, and the complement data input signal is passed directly to a complement data output signal. Because the data input signal is passed directly to a data output terminal, and the complement data input signal is passed directly to a complement data output signal, the clock-to-q time may be reduced. In addition, because the data input signal and the complement data input signal drive opposite sides of the cross-coupled pair of gates, the state of the cross-coupled pair of gates can be more quickly set to a desired state. This helps reduce the clock-to-q time, as well as the setup time.

6 Claims, 8 Drawing Sheets

OTHER PUBLICATIONS

Document entitled "Implementation Of Digital Controller For An Interleaved DC/DC Buck Converter" by Dejan Markovic and Jinwen Xiao, in the EECS 241, Spring 1999, Final Project Report, all pages.

J.B. Burr and J. Shott, "A 200 mV self–testing encoder/decoder using Stanford ultra–low–power CMOS", ISSCC 94 Conference Digest, 1994, pp. 84–85.

V. Stojanovic and V.G. Oklobzdija, "Comparative analysis of master–slave latches and flip–flops for high–performance and low–power systems", IEEE Journal of Solid–State Circuits, vol. 34, No. 4, Apr. 1999, pp. 536–548.

Kim, et al., (1990), *IEEE Journal of Solid–State Circuits*, vol. 25, No. 4, pp 942–951.

* cited by examiner

Prior Art

HIGH SPEED LATCH AND FLIP-FLOP

BACKGROUND OF THE INVENTION

The present invention generally relates to electronic storage devices, and more particularly, to latch and flip-flop circuits commonly used in digital electronic devices.

Advances in integrated circuit technology and design have led to a rapid increase in integrated circuit performance. A good example of this increase in performance can be seen in microprocessors. Only a few years ago, state-of-the-art microprocessors shipped with personal computers had clock rates of around 60 MHz. Today, personal computers are commonly shipped with microprocessors having clock rates of 600 MHz or more.

Figure 1:
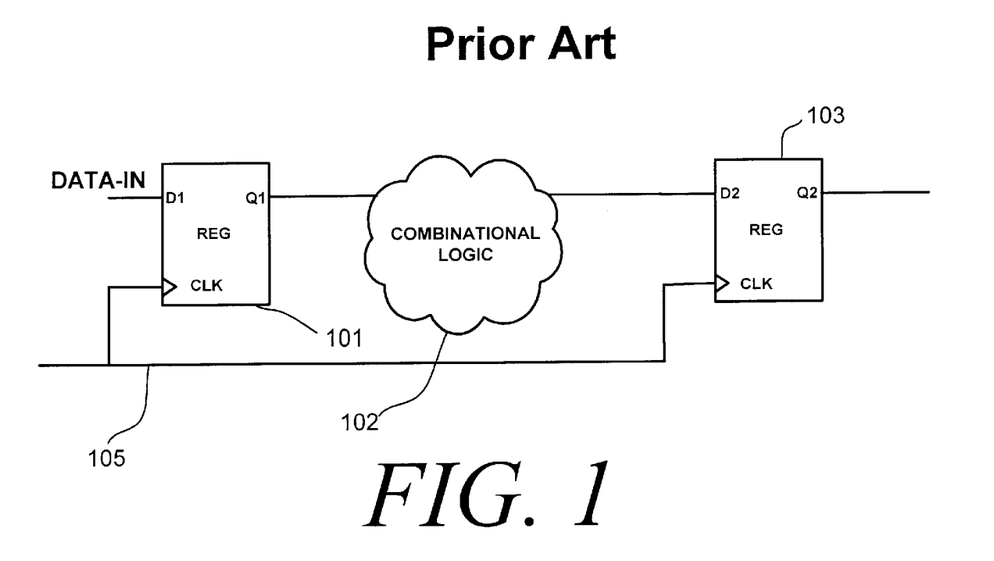
FIG. 1 is a schematic diagram of a delay path of a typical digital circuit.

FIG. 1 shows a typical delay path within a digital circuit. Such delay paths are commonly used in microprocessors and other digital circuits. A typical delay path includes a first register 101, a second register 103 and a combinational logic block 102 located therebetween. In the diagram shown, both the first register 101 and the second register 103 are clocked by a common clock signal 105. For purposes of illustration, both the first register 101 and the second register 103 are assumed to be positive edge triggered master-slave flip-flops.

Figure 2:
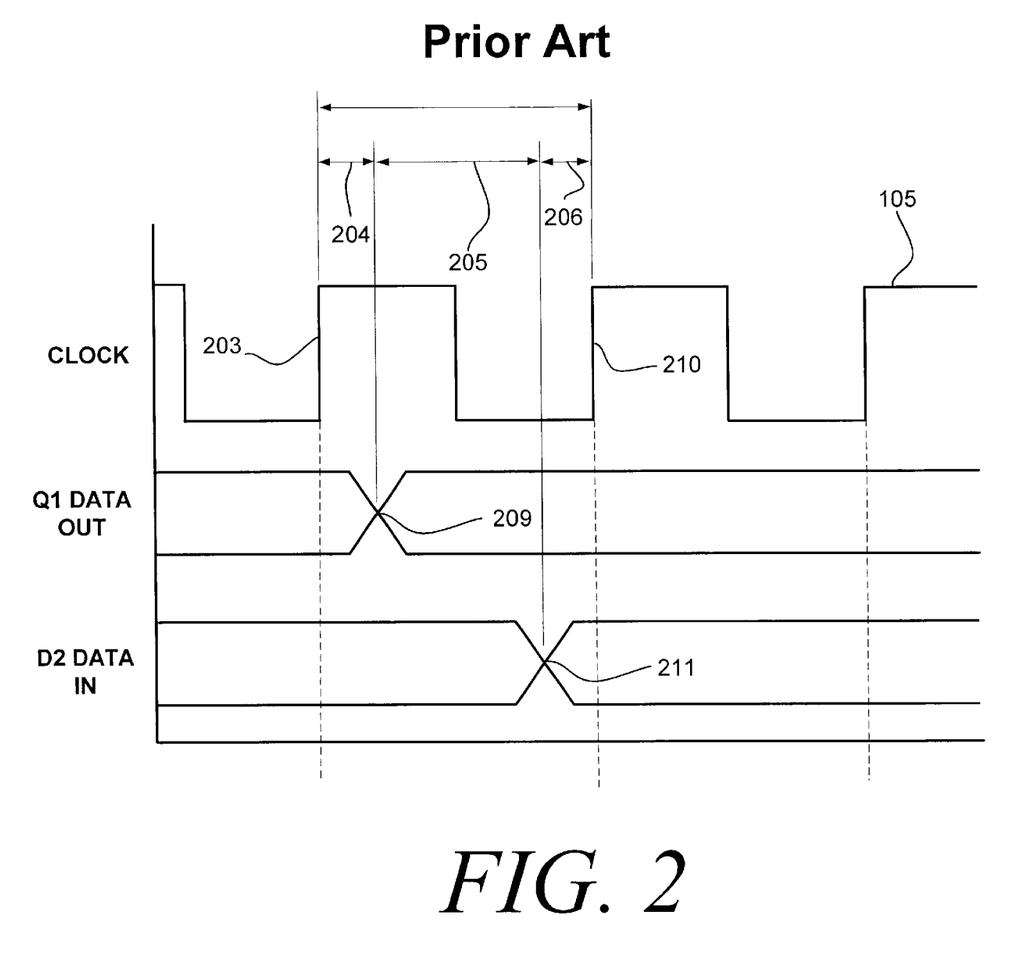
FIG. 2 is a timing diagram for the delay path of FIG. 1.

In operation, and as shown in FIG. 2, the first register 101 releases data to the combinational logic 102 at a first positive edge of the clock signal 105. There is typically a delay 204, commonly referred to as a clock-to-q delay, before the data actually emerges from the first register 101. The data emerging from the first register 101 is shown at 209. The clock-to-q delay 204 typically corresponds to the time required to propagate the data signal through the slave of the master-slave flip-flop, as further described below. Once the data emerges from the first register 101, the data must propagate through the combinational logic block 102, and arrive at the data input of the second register 103 at least one setup time 206 before the next positive edge of the clock signal 105. The arrival of the data at the data input of the second register is shown at 211. The setup time 206 typically corresponds to the time required to set the state of the master of the master-slave flip-flop, as further described below.

To maximize the performance of the delay path, it is desirable to minimize the clock-to-q delay 204 and the setup time 206. This leaves the maximum amount of propagation time 205 for the data to travel through the combinational logic block 102. By reducing the clock-to-q delay 204 and/or the setup time 206, the clock rate of the clock signal 105 can be increased, thereby increasing the performance of the corresponding digital circuit. Alternatively, a longer delay path can be provided in the combinational logic block 102, which may help reduce the number of pipeline stages often required in many of today's microprocessors.

Figure 3:
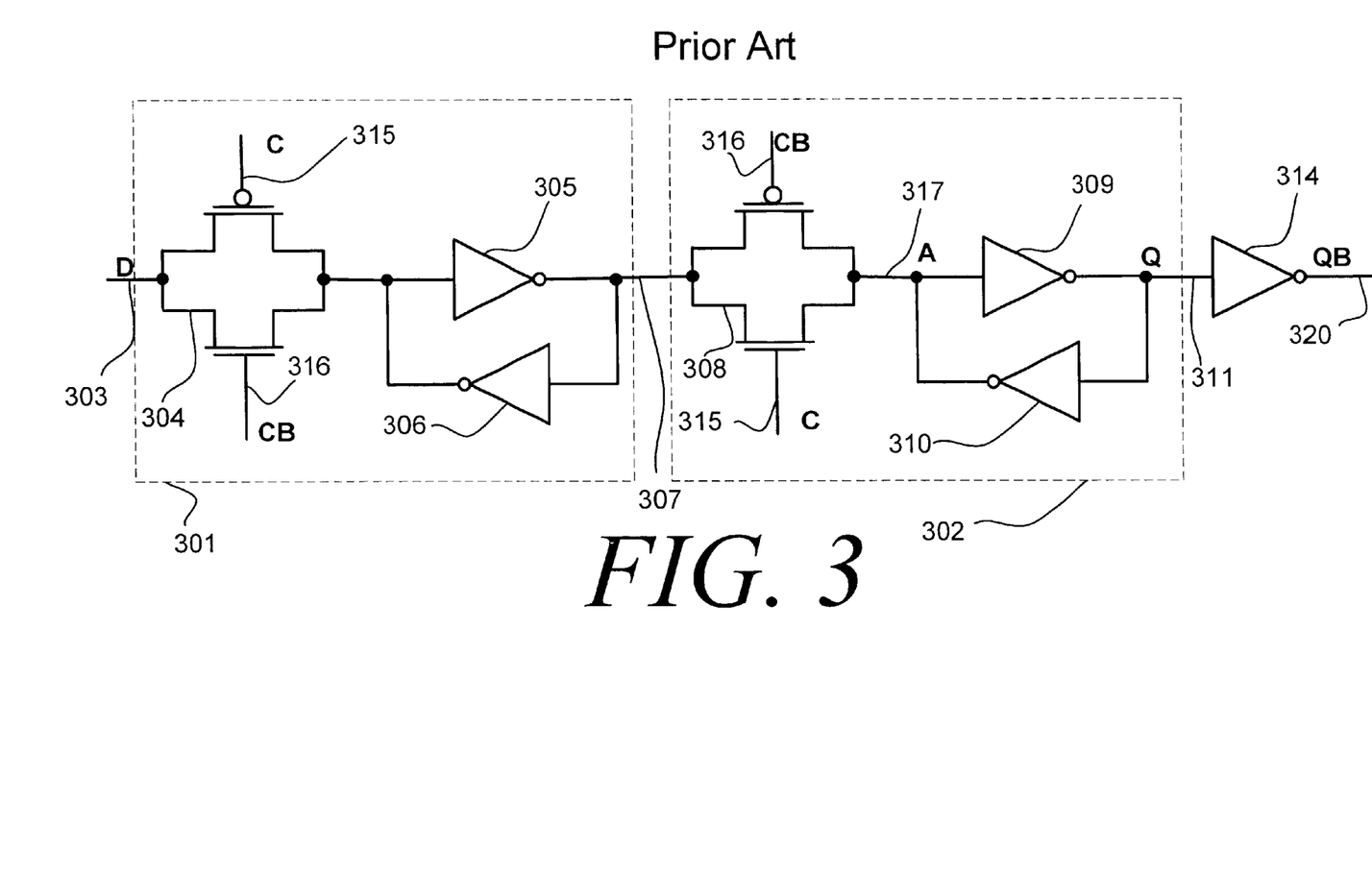
FIG. 3 is a schematic diagram of a typical prior art flip-flop circuit.

FIG. 3 is a schematic diagram of a typical positive edge triggered master-slave flip-flop in accordance with the prior art. The flip-flop includes a master latch 301 and a slave latch 302, with the output of the master latch 301 coupled to the input of the slave latch 302. Because the illustrative master-slave flip-flop is positive edge triggered, the master latch 301 is transparent and the slave latch 302 is latched when the clock signal 315 is low, and the master latch 301 is latched and the slave latch 302 is transparent when the clock signal 315 is high.

The master latch 301 includes a pair of looped inverters 305 and 306 forming an inventor loop as shown in FIG. 3. One side of the looped inverters is coupled to a data output terminal 307, and the other side of the looped inverters is coupled to the data input terminal 303 of the master-slave flip-flop through a transmission gate 304. The transmission gate 304 connects the data input terminal 303 of the master-slave flip-flop to the input of the first inverter 305 and the output of the second inverter 306 when the clock signal 315 is low (and thus the complement clock signal 316 is high). In this state, the master latch 301 is transparent, allowing the data input signal 303 to set the state of the cross-coupled inverters 305 and 306.

The transmission gate 304 disconnects the data input terminal 303 from the input of the first inverter 305 and the output of the second inverter 306 when the clock signal 315 is high (and thus the complement clock signal 316 is low). In this state, the master latch 301 is latched, allowing the looped inverters 305 and 306 to store the state set by the data input signal 303.

Like the master latch 301, the slave latch 302 includes a pair of looped inverters 309 and 310. One side of the looped inverters 309 and 310 is coupled to a data output terminal 311, and the other side of the looped inverters is coupled to the output terminal 307 of the master latch 301 through a transmission gate 308. The transmission gate 308 connects the output terminal 307 of the master latch 301 to the input of the first inverter 309 and the output of the second inverter 310 when the clock signal 315 is high (and thus the complement clock signal 316 is low). In this state, the slave latch 302 is transparent, allowing the data output signal 307 of the master latch 301 to set the state of the looped inverters 309 and 310.

The transmission gate 308 disconnects the output terminal 307 of the master latch 301 from the input of the first inverter 309 and the output of the second inverter 310 when the clock signal 315 is low (and thus the complement clock signal 316 is high). In this state, the slave latch 302 is latched, allowing the looped inverters 309 and 310 to store the state set by the data output signal 307.

During operation, the clock signal 315 may initially be low and the complement clock signal 316 may be high. At this time, the master latch 301 is transparent, allowing the data input signal 303 to enter the master latch 301 and set the state of the looped inverters 305 and 306. The slave latch 302 is in a latched state, preventing the output signal 307 of the master latch 301 from reaching the looped inverters 309 and 310 of the slave latch 302.

The data input signal 303 must be stable for a sufficient period to set the state of the looped inverters 305 and 306 to a desired state before the clock signal 315 rises. As indicated above, this is referred to as the setup time of the master-slave flip-flop. For the master-slave flip-flop shown, the setup time corresponds to about three gate delays, including the delay through the transmission gate 304, the first inverter 305 and about three or more gate delays to produce a complement data output signal via second inventor 306 as shown in FIG. 3. When the clock signal 315 rises (and thus the complement clock signal 316 falls), the transmission gate 304 disconnects the data input signal 303 from the pair of looped inverters 305 and 306. The pair of looped inverters 305 and 306 then maintain or store the data state set during the setup period.

As the clock signal 315 rises, the transmission gate 308 of the slave latch 302 goes transparent, passing the data state stored in the master latch 301 to the output 311 of the master-slave flip-flop. That is, the rising edge of the clock signal 315 opens the transmission gate 308 of the slave latch 302, which then allows the data state on the output terminal 307 of the master latch 301 to propagate to the output terminal 311 of the slave latch 302. For the master-slave flip-flop shown, this delay corresponds to the clock-to-q delay. The clock-to q delay is about two gate delays, including the delay through the transmission gate 308 and the first inverter 309. If a complement output signal 320 is desired, the clock-to-q delay is increased to about three gate delays with the addition of inverter 314.

SUMMARY OF THE INVENTION

The present invention overcomes many disadvantages of the prior art by providing a latch and flip-flop circuit that has a reduced clock-to-q delay and/or a reduced setup time. The latch and flip-flop circuits preferably have both a data input signal and a complement data input signal. The data input signal and the complement data input signal are selectively connected to opposite sides of a pair of cross-coupled gates of the latch or flip-flop, preferably via a switch or the like. The switch is preferably controlled by an enable signal, such as a complement clock. When the switch is enabled, the data input signal is passed directly to a complement data output signal, and the complement data input signal is passed directly to a data output terminal. Because the data input signal is passed directly to the complement data output signal, and the complement data input signal is passed directly to the data output signal, the clock-to-q time may be reduced relative to the prior art. In addition, because the data input signal and the complement data input signal drive opposite sides of the pair of cross-coupled gates, the state of the pair of cross-coupled gates can be more quickly set to a desired state. This helps reduce the clock-to-q time, as well as the setup time.

In a first illustrative latch embodiment, the data input signal and the complement data input signal are provided to a first switch and a second switch, respectively, of the latch circuit. Each of the first and second switches is preferably an inverter type gate having a tri-stateable output. The state of the output of each of the inverter type gates may be controlled by an enable signal such as a clock signal. When the first switch and the second switch are enabled, the first switch passes the data input signal to a first side of a pair of cross-coupled inverters and the second switch passes the complement data input signal to a second opposite side of the cross-coupled inverters. The latch preferably has a data complement output terminal that corresponds to the first side of the cross-coupled inverters and a data output terminal that corresponds to the second side of the cross-coupled inverters.

An illustrative flip-flop of the present invention combines two of the latch circuits discussed above. In this embodiment, the data output terminal of the master latch is connected to a data input terminal of the slave latch, and the complement data output terminal of the master latch is connected to the complement data input terminal of the slave latch. For a positive edge triggered flip-flop, the first and second switch elements of the master latch are enabled when the clock signal is low, and the first and second switch elements of the slave latch are enabled when the clock signal is high.

It is contemplated that each of the first and second switch elements of the master latch and slave latch may be implemented in any number of ways. For example, each of the first and second switch elements may be formed from a single transistor, with the gate of the single transistor coupled to the clock signal. Alternatively, each of the first and second switch elements may be formed from a transmission gate. The transmission gate may have an n-channel transistor and a p-channel transistor, with the gate of the n-channel transistor coupled to a clock signal and the gate of the p-channel transistor coupled to a complement clock signal, or visa versa. Further still, and in a preferred embodiment, the first and second switch elements may be formed from an inverter type gate having a tri-stateable output, with the state of the output controlled by a clock and/or complement clock signal. In this latter case, the switching function of the first and second switch elements may be combined into a single circuit, which as described below, may reduce the number of transistors required to form the switching element circuits.

DETAILED DESCRIPTION OF THE PREFERRED EMBODIMENTS

Figure 4:
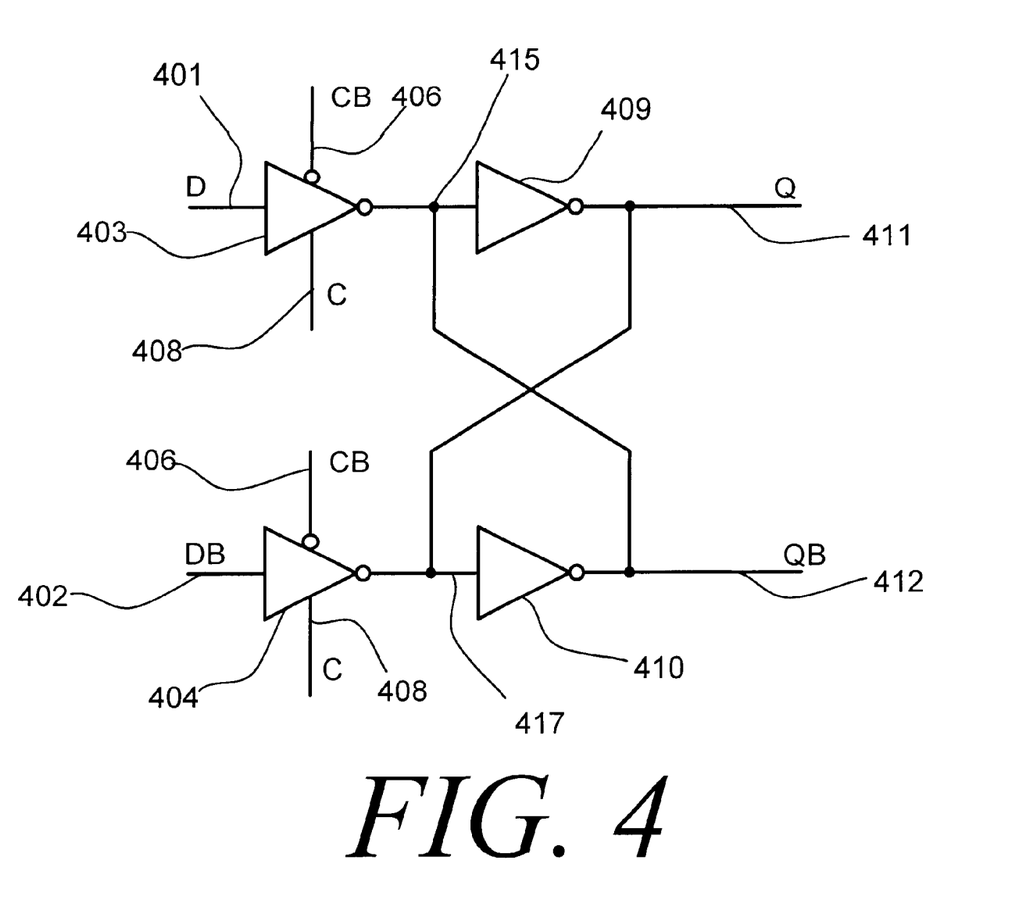
FIG. 4 is a schematic diagram of an illustrative latch in accordance with the present invention.

FIG. 4 is a schematic diagram of an illustrative latch in accordance with the present invention. The latch includes a pair of inverters 409 and 410 coupled together in a cross-coupled configuration. While cross-coupled inverters are shown in FIG. 4, it is contemplated that other types of gates may be used, such as AND gates, OR gates, XOR gates, etc. These alternative gates may be desirable when forming, for example, RS flip-flops, JK-flip-flops, etc.

A first side 415 of the pair cross-coupled inverters 409 and 410 is preferably coupled to the data input terminal 401 of the latch through a first switch element 403. Similarly, a second side 417 of the pair of cross-coupled inverters 409 and 410 is preferably coupled to the complement data input terminal 402 of the latch through a second switch element 404.

Each of the first and second switch elements 403 and 404 are shown as inverting type gates having a tri-stateable output. As indicated above, however, it is contemplated that the first and second switch elements 403 and 404 may be implemented using, for example, a single transistor, a transmission gate, etc. The first and second switch elements 403 and 404 are preferably controlled by a clock signal 406 and a complement clock signal 408, as shown. In this configuration, when the clock signal is high, and the complement clock signal is low, the first switch element 403 connects the data input signal 401 of the latch to the first side 415 of the pair of cross-coupled inverters 409 and 410. Likewise, the second switch element 404 connects the complement data input signal 402 of the latch to the second side 417 of the pair of cross-coupled inverters 409 and 410.

When the clock signal is low, and the complement clock signal is high, the first switch element 403 disconnects the data input signal 401 of the latch from the first side 415 of the pair of cross-coupled inverters 409 and 410. Likewise, the second switch element 404 disconnects the complement data input signal 402 of the latch from the second side 417 of the pair of cross-coupled inverters 409 and 410.

As can readily be seen, when the first and second switch elements 403 and 404 are enabled, the data input signal 401 of the latch is passed directly to the complement data output terminal 412 after being inverted by the first switch element 403. Likewise, the complement data input signal 402 of the latch is passed directly to the data output signal 411 after being inverted by the second switch element 404. Because the data input signal 401 is passed directly to the complement data output terminal 412 by the first switch element 403, and the complement data input signal 402 is passed directly to the data output signal 411 by the second switch element 404, the clock-to-q time of the latch may be reduced relative to the prior art. In addition, because the data input signal 401 and the complement data input signal 402 drive both sides of the cross-coupled pair of gates 409 and 410, but in opposite directions, the state of the cross-coupled pair of gates 409 and 410 can be more quickly set. This may also help reduce the clock-to-q time, as well as reduce the setup time.

Figure 5:
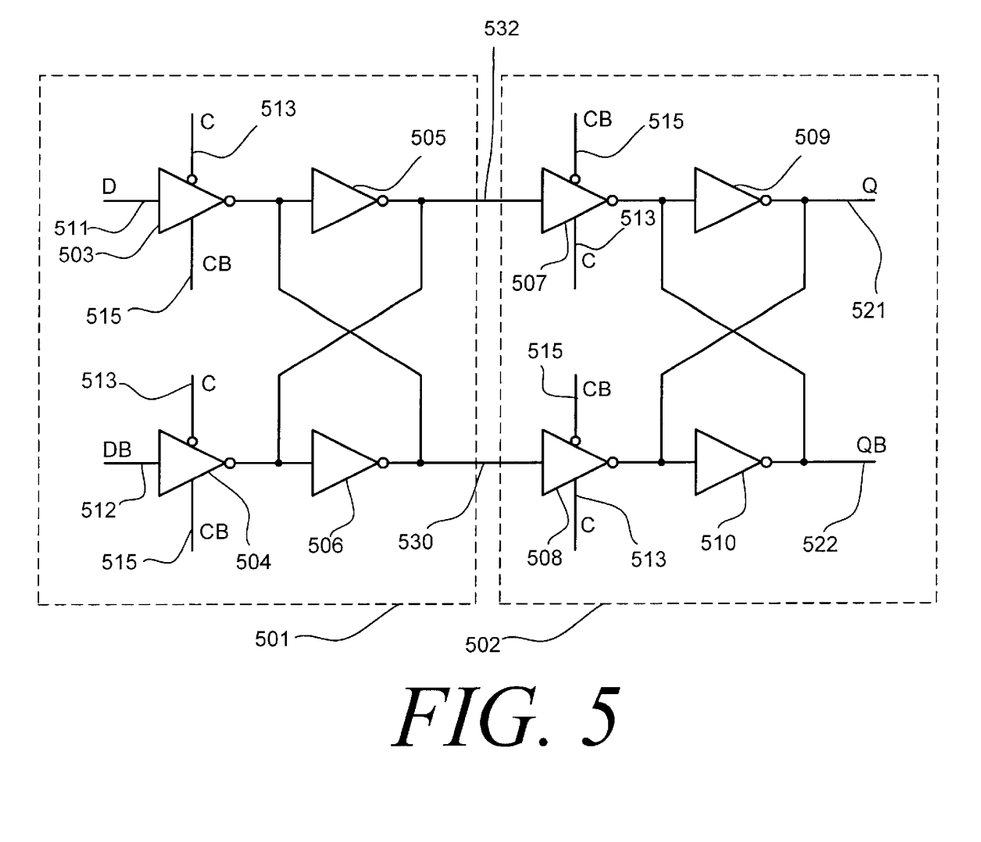
FIG. 5 is a schematic diagram of an illustrative master-slave flip-flop in accordance with the present invention.

FIG. 5 is a schematic diagram of an illustrative master-slave flip-flop in accordance with the present invention. As can be seen, this embodiment combines two of the latch circuits of FIG. 4 to form the master-slave flip-flop of FIG. 5. In this embodiment, the data output terminal 530 of the master latch 501 is connected to the data input terminal of the slave latch 502, and the complement data output terminal 532 of the master latch 501 is connected to the complement data input terminal of the slave latch 502.

The first and second switch elements 503 and 504 of the master latch 501 are preferably enabled when the clock signal 513 is high, and the first and second switch elements of the slave latch 502 are preferably enabled when the clock signal is low. This provides a positive edge triggered master-slave flip-flop. The polarities of the clock and complement clock signal may be reversed to provide a negative edge triggered flip-flop.

During operation, the clock signal 513 may initially be low and the complement clock signal 515 may be high. At this time, the master latch 501 is transparent, allowing the data input signal 511 and the complement data input signal 512 to enter the master latch 501 and set the state of the cross-coupled inverters 505 and 506. In contrast, the slave latch 502 is in a latched state, preventing the output signals 530 and 532 of the master latch 501 from reaching the cross-coupled inverters 509 and 510 of the slave latch 502.

As with prior art flip-flops, the data input signal 511 and the complement data input signal 512 must be stable for a sufficient period to set the cross-coupled inverters 505 and 506 to the desired state before the clock signal 513 rises. This is referred to as the setup time of the master-slave flip-flop. For the master-slave flip-flop shown in FIG. 5, the setup time corresponds to about one gate delay, or the gate delay through the first and/or second switch elements 503 and 504. This is substantially less than the setup time of the prior art flip-flop of FIG. 3, which as described above, is about three gate delays to produce a data output signal and about three gate delays to produce a complement data output signal.

Upon the rising edge of the clock signal 513 (and thus the falling edge of the complement clock signal 515), the switch elements 503 and 504 disconnect the data input signal 511 and the complement data input signal 512 from the pair of cross-coupled inverters 505 and 506. The pair of cross-coupled inverters 506 and 505 then maintains or stores the state set during the setup period.

At the same time, when the clock signal 513 rises, the switch elements 507 and 508 of the slave latch 502 go transparent, passing the data state stored in the master latch 501 to the data output 521 and the complement data output 522 of the master-slave flip-flop. The rising edge of the clock signal 513 opens switch elements 507 and 508 of the slave latch 502, which then allows the data state on the output terminals 530 and 532 of the master latch 501 to propagate to the output terminals 521 and 522 of the slave latch 502. Accordingly, the clock-to-q delay of the master-slave flip-flop of FIG. 5 is about one gate delay, or the gate delay through the first and/or second switch elements 507 and/or 508 of the slave latch 502. This is substantially less than the clock-to-q time of the prior art flip-flop of FIG. 3, which as described above, is about two gate delays to produce a data output signal and about three gate delays to produce a complement data output signal.

In the embodiment shown, the first and second switch elements 503, 504, 507 and 508 of the master latch 501 and the slave latch 502 are implemented using inverter type gates having a tri-stateable output. The state of the output is preferably controlled by the clock signal 513 and the complement clock signal 515. Various other embodiments for the first and second switch elements 503, 504, 507 and 508 are shown and described with respect to FIGS. 6–8 below.

Figure 6:
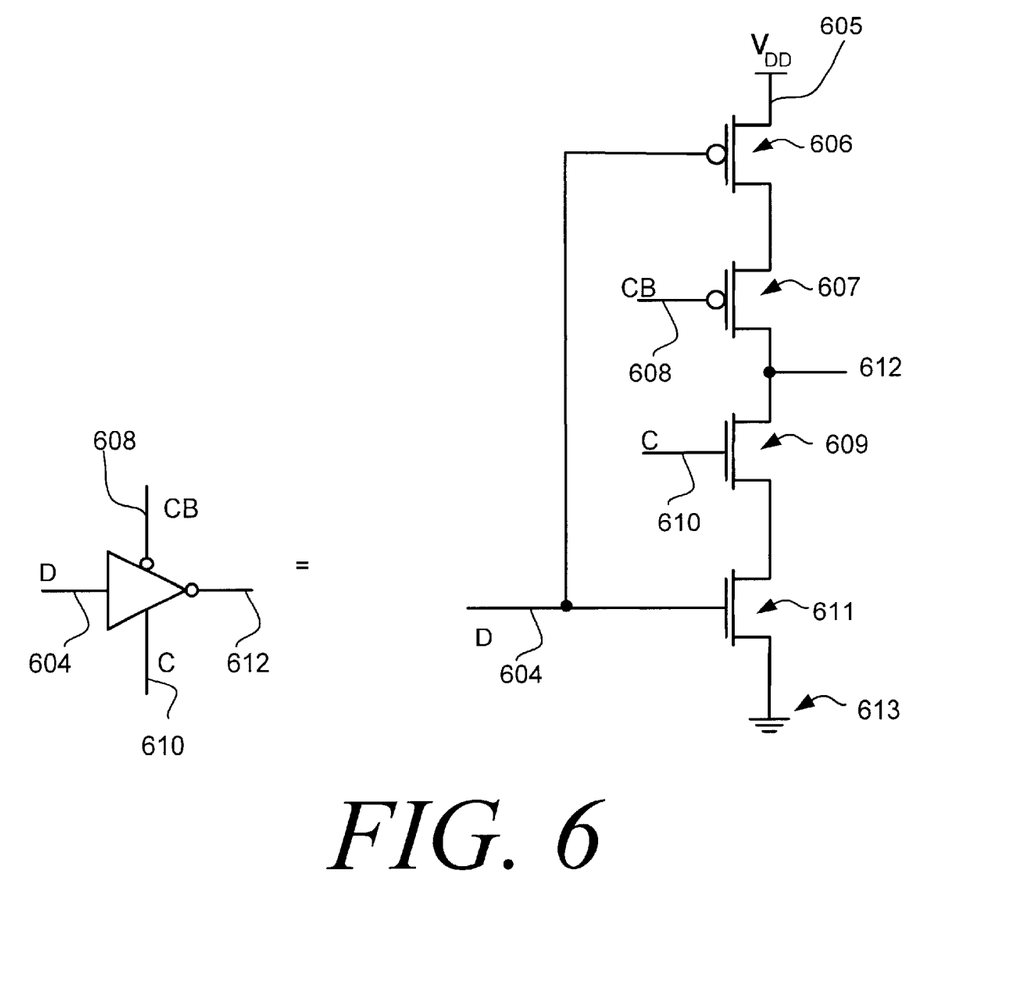
FIG. 6 is a schematic diagram of an illustrative inverter type gate having a tri-stateable output.

FIG. 6 is a schematic diagram of an illustrative inverter type gate having a tri-stateable output. The inverter type gate of FIG. 6 is preferably equivalent to the inverter type gates 503, 504, 507 and 508 of FIG. 5. The inverter type gate of FIG. 6 includes a first p-channel transistor 606, a second p-channel transistor 607, a first n-channel transistor 609 and a second n-channel transistor 611. The first p-channel transistor 606 has a source coupled to a reference voltage 605, a gate coupled to a data input signal 604, and a drain. The second p-channel transistor 607 has a source coupled to the drain of the first p-channel transistor 606, a gate coupled to the complement clock signal 608, and a drain coupled to an output terminal 612.

The first n-channel transistor 609 has a drain coupled to the output terminal 612, a gate coupled to the clock signal 610, and a source. The second n-channel transistor 611 has a drain coupled to the source of the first n-channel transistor 609, a gate coupled to the data input signal 604, and a source coupled to ground.

When the clock signal 610 is high and the complement clock signal 608 is low, both the second p-channel transistor 607 and the first n-channel transistor 610 are on. Thus, when the data input signal 604 is high, the second n-channel transistor 611 pulls the data output terminal 612 low. Likewise, when the data input signal 604 is low, the first p-channel transistor 606 pulls the data output terminal 612 high. When the clock signal 610 is low and the complement clock signal 608 is high, both the second p-channel transistor 607 and the first n-channel transistor 610 are off, thereby effectively disconnecting the data input signal 604 from the data output terminal 612.

Figure 7:
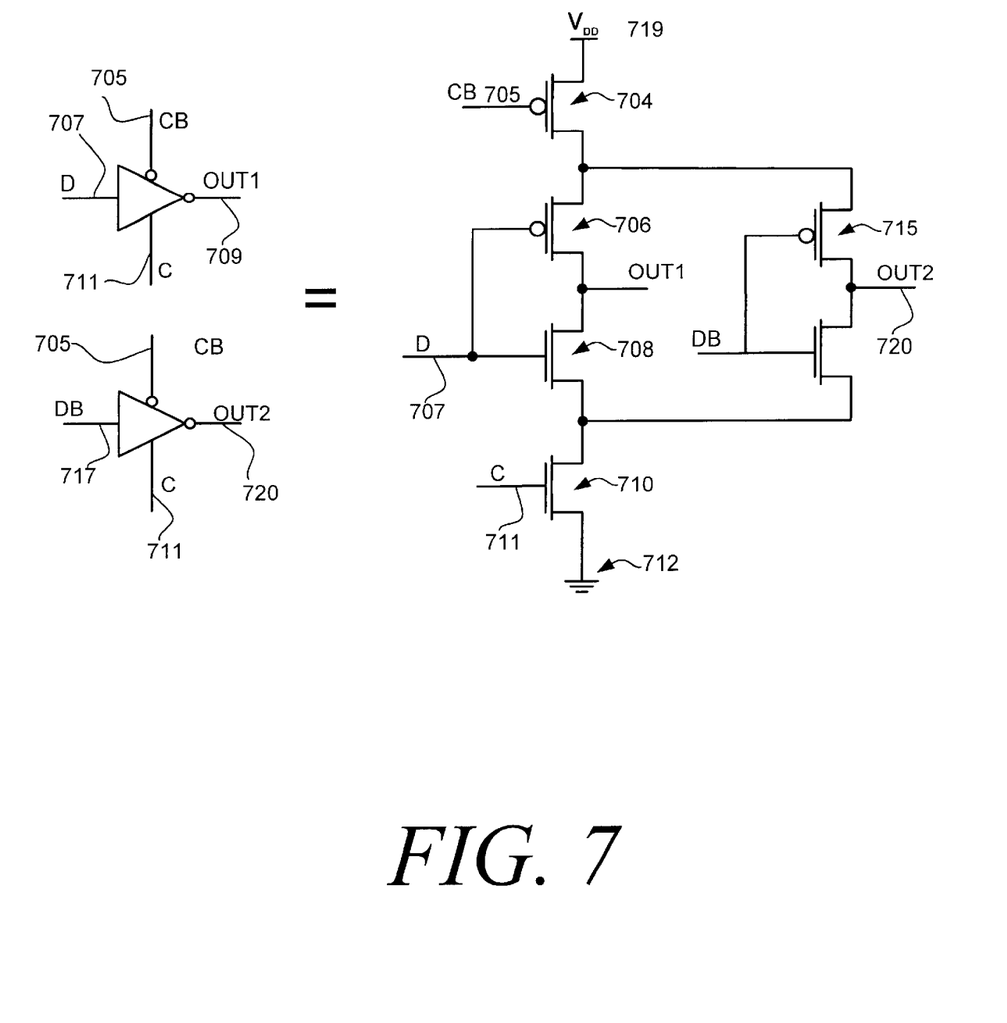
FIG. 7 is a schematic diagram of another illustrative inverter type gate having a tri-stateable output.

FIG. 7 is a schematic diagram of another illustrative inverter type gate having a tri-stateable output. In this embodiment, two transistors are eliminated relative to the embodiment of FIG. 6 by combining the switching function of two switch elements, such as switch elements 503 and 504 of FIG. 5. In this embodiment, a first p-channel transistor 704 and a first n-channel transistor 710 are used to enable and disable the inverter type gate. These transistors are shared by the data input signal and complement data input signal switching functions, as further described below. The first p-channel transistor 704 has a source coupled to a reference voltage 719, a gate coupled to a complement clock signal 705, and a drain. The first n-channel transistor 710 has a source coupled ground 712, a gate coupled to a clock signal 711, and a drain.

To provide the switching function for the data input signal 707, a second p-channel transistor 706 and a second n-channel transistor 708 are provided. The second p-channel transistor 706 has a source coupled to the drain of the first p-channel transistor 704, a gate coupled to the data input signal 707, and a drain coupled to a data output terminal 709. The second n-channel transistor 708 has a drain coupled to the data output terminal 709, a gate coupled to the data input signal 707, and a source coupled to the data output terminal 709.

To provide the switching function for the complement data input signal 717, a third p-channel transistor 715 and a third n-channel transistor 716 are provided. The third p-channel transistor 715 has a source coupled to the drain of the first p-channel transistor 704, a gate coupled to the complement data input signal 717, and a drain coupled to a complement data output terminal 720. The third n-channel transistor 716 has a drain coupled to the complement data output terminal 720, a gate coupled to the complement data input signal 717, and a source coupled to the drain of the first n-channel transistor 710.

When the clock signal 711 is high and the complement clock signal 705 is low, both the first p-channel transistor 704 and the first n-channel transistor 710 are on. Thus, when the data input signal 707 is high, the second n-channel transistor 710 pulls the data output terminal 709 low. The second p-channel transistor 706 is off. When the data input signal 707 is low, the second p-channel transistor 706 pulls the data output terminal 709 high. The second n-channel transistor 708 is off.

Likewise, when the complement data input signal 717 is high, the third n-channel transistor 716 pulls the complement data output terminal 720 low. The third p-channel transistor 715 is off. Finally, when the complement data input signal 717 is low, the third p-channel transistor 715 pulls the complement data output terminal 720 high. The third n-channel transistor 716 is off.

Figure 8:
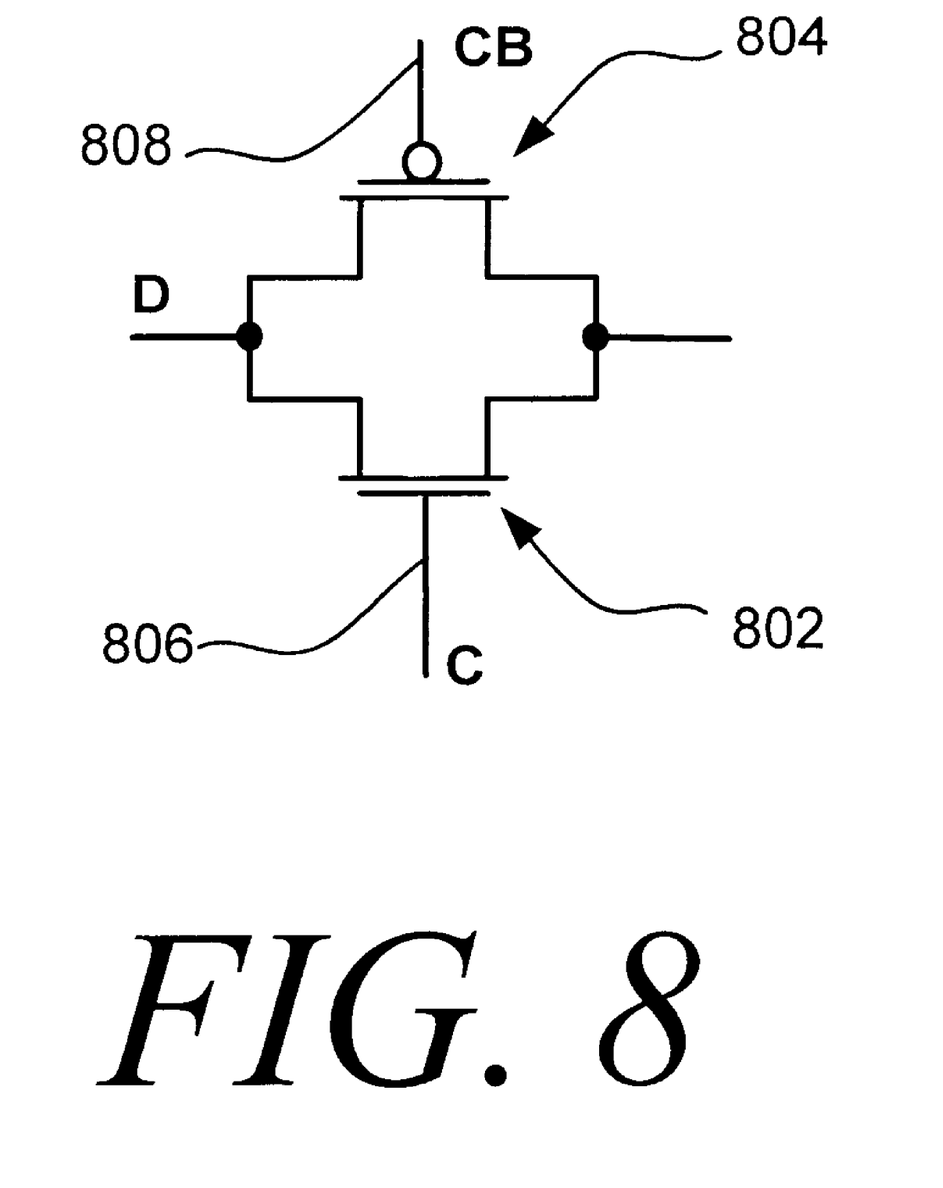
FIG. 8 is a schematic diagram of a switch implemented using a transmission gate.

FIG. 8 is a schematic diagram of a switch implemented as a transmission gate. Rather than providing a inverter type gate having a tri-stateable output as shown and described with reference to FIGS. 6–7, it is contemplated that each of the first and second switch elements may be formed from a transmission gate or the like. The transmission gate may have an n-channel transistor 802 and a p-channel transistor 804, with the gate of the n-channel transistor 802 coupled to a clock signal 806 and the gate of the p-channel transistor 804 coupled to a complement clock signal 808, or visa versa. Alternatively, it is contemplated that each of the first and second switch elements may be formed from a single transistor, with the gate of the single transistor coupled to a clock signal. Numerous other configurations are also contemplated.

Finally, a method for writing a desired data state to a pair of cross-coupled logic gates is contemplated. As indicated above, a pair of cross coupled logic gates may have a first terminal that is connected to the output of a first one of the cross-coupled logic gates and to the input of the second one of the cross-coupled logic gates. A pair of logic gates may further have a second terminal that is connected to the input of the first one of the cross-coupled logic gates and to the output of the second one of the cross-coupled logic gates.

An input data signal and a complement input data signal are provided. The input data signal and a complement input data signal preferably correspond to a desired data state. A clock signal is also preferably provided, wherein the clock signal can have a first logic state and a second logic state.

To write the pair of cross-coupled logic gates, the input data signal is driven to the first terminal of the cross-coupled logic gates and the complement input data signal is driven to the second terminal of the cross-coupled logic gates. This is performed when the clock signal is in the first logic state. Then, when the clock signal is in the second logic state, the input data signal is disconnected from the first terminal of the cross-coupled logic gates and the complement input data signal is disconnected from the second terminal of the cross-coupled logic gates.

It is contemplated that a data output signal may be provided from the first output terminal and a complement data output signal may be provided from the second output terminal. The data output signal may be driven to the first terminal of a slave pair of cross-coupled logic gates, and the complement data output signal may be driven to the second terminal of the slave pair of cross-coupled logic gates. This is preferably done when the clock signal is in the second logic state. Finally, when the clock signal is in the first logic state, the data output signal may be disconnected from the first terminal of the slave pair of cross-coupled logic gates and the complement data output signal may be disconnected from the second terminal of the slave pair of cross-coupled logic gates.

Having thus described the preferred embodiments of the present invention, those of skill in the art will readily appreciate that the teachings found herein may be applied to yet other embodiments within the scope of the claims hereto attached.

What is claimed is:

1. A master-slave flip-flop comprising:
   a clock input for carrying a clock signal having a first and second state;
   a master storage device for storing a master data state, said master storage device having a master storage input for receiving a master storage input signal, a master storage complement input for receiving a master storage complement input signal, a master storage output for carrying a master storage output signal, and a master storage complement output, for carrying a master storage complement output signal;
   a master switch having a data input for carrying a data input signal and a complement data input for carrying a complement data input signal, the master switch operates to pass the data input signal to the master storage input and the master input signal is passed directly to the master storage complement output when the clock is in the first state, the master switch operates to pass the complement data input signal to the master storage complement input and the master storage complement input signal is passed directly to the master storage output when the clock is in the first state, the master switch disconnecting the data input signal from the master storage input and from the master storage complement output when the clock is in the second state, the master switch disconnecting the complement data input signal from the master storage complement input and from the master storage output when the clock is in the second state, thereby storing the master data state in the master storage device when the clock is in the second state;

a slave storage device for storing a slave data state, said slave storage device having a slave storage input for receiving a slave storage input signal, a slave storage complement input for receiving a slave storage complement input signal, a data output for carrying a data output signal, and a complement data output for carrying a complement data output signal; and a slave switch operates to pass the master storage output signal to the slave storage input and the slave storage input signal is passed directly to the complement data output when the clock is in the second state, the slave switch operates to pass the master storage complement output signal to the slave storage complement input and the slave storage complement input signal is passed directly to the data output when the clock is in the second state, the slave switch disconnecting the master storage output signal from the slave storage input and from the complement data output when the clock is in the first state, the slave switch disconnecting the master storage complement output signal from the slave storage complement input and from the data output when the clock is in the first state thereby storing the slave data state in the slave storage device when the clock is in the first state, wherein the set-up time for the master switch is less than two gate delays and the set-up time for the slave switch is less than two gate delays.

2. The master-slave flip-flop of claim 1,
wherein the master storage device comprises;
  a master inverter having an output coupled to the master storage output and an input forming the master storage input and cross-coupled to the master storage complement output;
  a master complement inverter having an output coupled to the master storage complement output and an input forming the master storage complement input and cross-coupled to the master storage output,
wherein the slave storage device comprises;
  a slave inverter having an output coupled to the data output and an input forming the slave storage input and cross-coupled to the complement data output; and
  a slave complement inverter having an output coupled to the complement data output and an input forming the slave storage complement input and cross-coupled to the data output,
  wherein the master and the slave pair of cross-coupled inverters each have no cross-coupling resistors to permit a logic level difference.

3. The master-slave flip-flop according to claim 2 wherein the master inverter has a master inverter state, the master complement inverter has a master complement inverter state, the slave inverter has a slave inverter state, the slave complement inverter has a slave complement inverter state, wherein, the master inverter state is more quickly set when the data input signal is passed directly to both the master storage input and to the master storage complement output when the clock is in the first state, the master complement inverter state is more quickly set when the complement data input signal is passed directly to both the master storage complement input and to the master storage output when the clock is in the first state, the slave inverter state is more quickly set when the master storage output signal is passed directly to both the slave storage input and to the complement data output when the clock is in the second state, the slave complement inverter state is more quickly set when the master complement output signal is passed directly to both the slave storage complement input and to the data output when the clock is in the second state.

4. The master-slave flip-flop according to claim 1, wherein the master-slave flip-flop further comprises a complement clock input for carrying a complement clock signal.

5. The master-slave flip-flop according to claim 4 wherein the master switch comprises:

a first p-channel transistor having a gate, a source, and a drain, wherein the source of the first p-channel transistor is connected to a reference voltage, and wherein the gate of the first p-channel transistor receives the complement clock signal;

a second p-channel transistor having a gate, a source, and a drain, wherein the gate of the second p-channel transistor is connected to the data input signal, and wherein the source of the second p-channel transistor is connected to the drain of the first p-channel transistor to form a first junction;

a first n-channel transistor having a gate, a source, and a drain, wherein the gate of the first n-channel transistor is connected to the data input signal, and wherein the drain of the first n-channel transistor is connected to the drain of the second p-channel transistor forming a master switch output to carry a master switch output signal passing directly to the master storage input and to the master storage complement output;

a second n-channel transistor having a gate, a source, and a drain, wherein the gate of the second n-channel transistor receives the clock signal, wherein the source of the second n-channel transistor is connected to a ground, and wherein the drain of the second n-channel transistor is connected to the source of the first n-channel transistor to form a second junction; p1 a third p-channel transistor having a gate, a source, and a drain, wherein the source of the third p-channel transistor is coupled to the first junction, and wherein the gate of the third p-channel transistor is coupled to the complement data input signal; and a third n-channel transistor having a gate, a source, and a drain, and wherein the source of the third n-channel transistor is connected to the second junction, wherein the drain of the third n-channel transistor is connected to the drain of the third p-channel transistor forming a master switch complement output to carry a master switch complement output signal passing directly to the master storage complement input and to the master storage output, and wherein the gate of the third n-channel transistor is connected to the complement data input signal.

6. The master-slave flip flop according to claim 3 wherein the slave switch comprises:

a first p-channel transistor having a gate, a source, and a drain wherein, the source of the first p-channel transistor is connected to a reference voltage, and wherein the gate of the first p-channel transistor receives the clock signal;

a second p-channel transistor having a gate, a source, and a drain, and wherein the gate of the second p-channel transistor is connected to the master storage output signal, and wherein the source of the second p-channel transistor is connected to the drain of the first p-channel transistor to form a first junction;

a first n-channel transistor having a gate, a source, and a drain, wherein the gate of the first n-channel transistor is connected to the master storage output signal, and wherein the drain of the first n-channel transistor is connected to the drain of the second p-channel transistor forming a slave switch output to carry a slave switch output signal passing directly to the slave storage input and to the data complement output;

a second n-channel transistor having a gate, a source, and a drain, wherein the gate of the second n-channel transistor receives the complement clock signal, wherein the source of the second n-channel transistor is connected to a ground, the drain of the second n-channel transistor is connected to the source of the first n-channel transistor to form a second junction;

a third p-channel transistor having a gate, a source, and a drain, wherein the source of the third p-channel transistor is coupled to the first junction, and wherein the gate of the third p-channel transistor is coupled to the master storage complement output; and a third n-channel transistor having a gate, a source, and a drain, wherein the source of the third n-channel transistor is connected to the second junction, wherein the drain of the third n-channel transistor is connected to the drain of the third p-channel transistor forming a slave switch complement output creating a slave switch complement output signal passed directly to the slave storage complement input and to the data output, and wherein the gate of the third n-channel transistor is connected to the master storage complement output.

* * * * *

UNITED STATES PATENT AND TRADEMARK OFFICE
CERTIFICATE OF CORRECTION

PATENT NO. : 6,417,711 B2
DATED : July 9, 2002
INVENTOR(S) : David E. Fulkerson

It is certified that error appears in the above-identified patent and that said Letters Patent is hereby corrected as shown below:

<u>Title page,</u>
Replace residence of inventor from "Chanhasen" to -- Chanhassen --.

<u>Column 8,</u>
Line 56, add -- storage -- after the word "master".

<u>Column 10,</u>
Line 43, delete "p1".

Signed and Sealed this

Twenty-ninth Day of October, 2002

*Attest:*

JAMES E. ROGAN
*Director of the United States Patent and Trademark Office*

*Attesting Officer*